US010478939B2

(12) United States Patent
Yoshizaki et al.

(10) Patent No.: US 10,478,939 B2
(45) Date of Patent: Nov. 19, 2019

(54) POLISHING METHOD

(71) Applicant: FUJIMI INCORPORATED, Kiyosu-shi, Aichi (JP)

(72) Inventors: Yukinobu Yoshizaki, Aichi (JP); Satoru Yarita, Kiyosu (JP); Shogo Onishi, Kiyosu (JP)

(73) Assignee: FUJIMI INCORPORATED (JP)

( * ) Notice: Subject to any disclaimer, the term of this patent is extended or adjusted under 35 U.S.C. 154(b) by 0 days.

(21) Appl. No.: 15/760,619

(22) PCT Filed: Sep. 21, 2016

(86) PCT No.: PCT/JP2016/077906
§ 371 (c)(1),
(2) Date: Mar. 15, 2018

(87) PCT Pub. No.: WO2017/057156
PCT Pub. Date: Apr. 6, 2017

(65) Prior Publication Data
US 2018/0257194 A1 Sep. 13, 2018

(30) Foreign Application Priority Data
Sep. 30, 2015 (JP) ................ 2015-192422

(51) Int. Cl.
B24B 37/04 (2012.01)
B24B 37/00 (2012.01)
C09G 1/02 (2006.01)
C09K 3/14 (2006.01)
H01L 21/306 (2006.01)
H01L 21/3105 (2006.01)
H01L 21/321 (2006.01)

(52) U.S. Cl.
CPC ............ B24B 37/044 (2013.01); B24B 37/00 (2013.01); C09G 1/02 (2013.01); C09K 3/1436 (2013.01); C09K 3/1463 (2013.01); H01L 21/30625 (2013.01); H01L 21/31053 (2013.01); H01L 21/3212 (2013.01)

(58) Field of Classification Search
CPC . B24B 37/044; B24B 37/00; H01L 21/30625; H01L 21/304; C09K 3/1436; C09K 3/14; C09G 1/02
See application file for complete search history.

(56) References Cited

U.S. PATENT DOCUMENTS

| 2003/0170991 A1* | 9/2003 | Wang ............ C09G 1/02 438/692 |
| 2004/0244823 A1 | 12/2004 | Kim et al. |
| 2009/0209104 A1* | 8/2009 | Kimura .......... C09G 1/02 438/693 |
| 2010/0001229 A1 | 1/2010 | Nakagawa et al. |
| 2011/0223840 A1 | 9/2011 | Morinaga et al. |
| 2014/0349484 A1 | 11/2014 | Yokota et al. |

FOREIGN PATENT DOCUMENTS

| JP | 2004-363611 A | 12/2004 |
| JP | 2009-170935 A | 7/2009 |
| JP | 2010-056127 A | 3/2010 |
| JP | 2011-211178 A | 10/2011 |
| JP | 2013-043893 A | 3/2013 |
| JP | 2013-138053 A | 7/2013 |
| WO | 2008/004579 A1 | 7/2007 |
| WO | 2015/052988 A1 | 8/2014 |

OTHER PUBLICATIONS

International Preliminary Report on Patentability for International Patent Application No. PCT/JP2016/077906 dated Apr. 12, 2018.
International Search Report for International Application No. PCT/JP2016/077906 dated Dec. 20, 2016.

* cited by examiner

Primary Examiner — Duy Vu N Deo
(74) Attorney, Agent, or Firm — Katten Muchin Rosenman LLP

(57) ABSTRACT

The present invention provides a means allowing achievement of sufficient planarization of the surface of an object to be polished containing two or more types of materials.
The present invention is a polishing method for polishing an object to be polished containing two or more types of materials by using a polishing composition, the polishing method including equalization of the surface zeta potential of the object to be polished.

6 Claims, No Drawings

POLISHING METHOD

TECHNICAL FIELD

The present invention relates to a polishing method.

BACKGROUND ART

In recent years, a so-called chemical mechanical polishing (CMP) technique for physically polishing and planarizing a semiconductor substrate in producing a device is used in accordance with multilayer wiring on a surface of a semiconductor substrate. CMP is a method for planarizing the surface of an object to be polished (polishing object) like a semiconductor substrate by using a polishing composition (slurry) containing abrasive grains such as silica, alumina, or ceria, an anticorrosive, a surfactant, or the like. The object to be polished (polishing object) is silicon, polysilicon, silicon oxide film (silicon oxide), silicon nitride, a wiring or a plug which consists of metal, or the like.

For example, as a CMP slurry for simultaneous polishing of a surface to be polished which includes a silicon oxide film and an aluminum film, an aqueous dispersion for chemical and mechanical polishing which contains silica particle having at least one kind of a functional group selected from the group consisting of a sulfo group and its salt, and a water-soluble polymer including a repeating unit originating in at least one kind selected from the group consisting of N-vinyl pyrrolidone and its derivative, and has pH of 2 or more and 8 or less is disclosed in JP 2013-43893 A.

SUMMARY OF INVENTION

However, according to the aqueous dispersion for chemical and mechanical polishing described in JP 2013-43893 A, there is a problem that planarization of a surface to be polished is insufficient.

Accordingly, an object of the present invention is to provide a means allowing achievement of sufficient planarization of a surface of an object to be polished containing two or more types of materials.

To solve the problem described above, the inventors of the present invention conducted intensive studies. As a result, it was found that the problem can be solved by a polishing method which includes equalization of the surface zeta potential of an object to be polished, and thus the present invention is completed accordingly.

The present invention is a polishing method for polishing an object to be polished containing two or more types of materials by using a polishing composition, the polishing method including equalization of the surface zeta potential of the object to be polished.

DESCRIPTION OF EMBODIMENTS

The present invention relates to a polishing method for polishing an object to be polished containing two or more types of materials by using a polishing composition, the polishing method comprising equalization of the surface zeta potential of the object to be polished. According to the polishing method of the present invention, as the surface zeta potential of an object to be polished containing two or more types of materials (surface to be polished) is almost equalized, planarization of the surface of an object to be polished can be sufficiently performed when an object to be polished is polished by using a polishing composition.

Furthermore, according to the polishing method of the present invention, an object to be polished can be polished at high polishing speed, and also scratches on a surface of the object to be polished can be reduced.

Hereinbelow, the present invention is explained in detail.
[Object to be Polished]
The object to be polished according to the present invention contains two or more types of materials. Examples of the material include a metal, an object to be polished which has a silicon-oxygen bond, an object to be polished which has a silicon-silicon bond, and an object to be polished which has a silicon-nitrogen bond.

Examples of the metal include copper, aluminum, hafnium, cobalt, nickel, titanium, and tungsten.

Examples of the object to be polished which has a silicon-oxygen bond include silicon oxide film, black diamond (BD: SiOCH), fluorosilicate glass (FSG), hydrogen silsesquioxane (HSQ), CYCLOTENE, SiLK, and methyl silsesquioxane (MSQ).

Examples of the object to be polished which has a silicon-silicon bond include polysilicon, amorphous silicon, monocrystalline silicon, n-type doped monocrystalline silicon, p-type doped monocrystalline silicon, and Si-based alloy like SiGe.

Examples of the object to be polished which has a silicon-nitrogen bond include silicon nitride film and SiCN (silicon carbonitride).

Among them, the object to be polished is preferably at least two types selected from the group consisting of copper, tungsten, silicon oxide film, polysilicon, and silicon nitride.

A more preferred mode of the object to be polished is a mode in which the aforementioned two or more types of materials include materials which have surface zeta potential with different signs before the equalization of surface zeta potential. Examples of a preferred combination of those materials include copper (surface zeta potential before equalization is −) and silicon oxide (surface zeta potential before equalization is +), tungsten (surface zeta potential before equalization is −) and silicon oxide (surface zeta potential before equalization is +), and aluminum (surface zeta potential before equalization is −) and silicon oxide (surface zeta potential before equalization is +).

Next, the polishing method of the present invention is explained in detail.

[Equalization of surface zeta potential] The polishing method of the present invention includes equalization of surface zeta potential of an object to be polished. As for the method for equalization, a method of using a potential equalizing agent which has an adsorbing group for adsorption onto the two or more types of materials as an object to be polished and a functional group for providing zeta potential is preferable. More specifically, mention can be made of (1) a method of including the potential equalizing agent in a polishing composition, (2) a method of impregnating in advance an object to be polished in the potential equalizing agent, and (3) a method of having neutral pH of a polishing composition. It is also acceptable that those methods are suitably combined with one another. Hereinbelow, descriptions are given for the methods of (1) to (3).

<Potential Equalizing Agent>

The potential equalizing agent according to the present invention preferably has an adsorbing group for adsorption onto the two or more types of materials as an object to be polished and a functional group for providing zeta potential.

The adsorbing group is preferably at least one selected from the group consisting of a phosphonic acid group, a carboxy group, a sulfonic acid group, a sulfuric acid group, a primary amino group, a secondary amino group, a tertiary amino group, and a quaternary ammonium group. Furthermore, the functional group is preferably at least one selected from the group consisting of a phenyl group, a styryl group, a phosphonic acid group, an amino group, a primary amino group, a secondary amino group, a tertiary amino group, and a quaternary ammonium group.

As a preferred example of a potential equalizing agent having both the adsorbing group and functional group, at least one of aminotriethylene phosphonic acid (both the adsorbing group and functional group are a phosphonic acid group) and dicyandiamide diethylenetriamine formalin condensate (for the structure, see the following General Formula (1), both the adsorbing group and functional group are a secondary amino group) is preferable. The potential equalizing agent may be used either singly or as a mixture of two or more types thereof. Furthermore, in the following General Formula (1), n represents number of a repeating unit.

[Chem. 1]

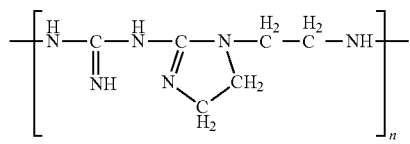

General Formula (1)

<(1) Method for Including Potential Equalizing Agent in Polishing Composition>

According to this method, by including the potential equalizing agent in a polishing composition used for polishing, equalization of the surface zeta potential of an object to be polished is achieved. Concentration of the potential equalizing agent in a polishing composition is preferably 0.01% by mass or more, and more preferably 0.1% by mass or more. Furthermore, concentration of the potential equalizing agent in a polishing composition is preferably 10% by mass or less, and more preferably 5% by mass or less.

As a method for adding the potential equalizing agent to a polishing composition, a method of stirring and mixing the potential equalizing agent with abrasive grains or the like in a dispersing medium in the method for producing a polishing composition described below can be mentioned, for example.

<(2) Method of Impregnating in Advance Object to be Polished in Potential Equalizing Agent>

According to this method, an object to be polished is impregnated in advance in a potential equalizing agent before polishing using a polishing composition, and thus equalization of the surface zeta potential of an object to be polished is achieved. As for the solution for impregnating an object to be polished, an aqueous solution of the aforementioned potential equalizing agent is preferable. Concentration of the potential equalizing agent in the aqueous solution is preferably 0.01% by mass or more, and more preferably 0.1% by mass or more. Furthermore, concentration of the potential equalizing agent in the aqueous solution is preferably 10% by mass or less, and more preferably 5% by mass or less.

Temperature for the impregnation is, although not particularly limited, preferably 10° C. or higher and 80° C. or lower, and more preferably 15° C. or higher and 40° C. or lower. Furthermore, time for the impregnation is, although not particularly limited, preferably 5 seconds or longer and 30 minutes or shorter, and more preferably 10 seconds or longer and 2 minutes or shorter.

With regard to the methods (1) and (2), pH of the polishing composition is not particularly limited, and a polishing composition having desired pH is used. As for the pH adjusting agent which is used for the case of adjusting pH, any of known acid, base, or a salt thereof can be used. Specific examples of the acid which may be used as a pH adjusting agent include an inorganic acid such as hydrochloric acid, sulfuric acid, nitric acid, fluoric acid, boric acid, carbonic acid, hypophosphorous acid, phosphorous acid, or phosphoric acid; and an organic acid such as formic acid, acetic acid, propionic acid, butyric acid, pentanoic acid, 2-methylbutyric acid, hexanoic acid, 3,3-dimethylbutyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarbonic acid, 2,5-furandicarbonic acid, 3-furancarbonic acid, 2-tetrahydrofurancarbonic acid, methoxyacetic acid, methoxyphenylacetic acid, or phenoxyacetic acid. When an inorganic acid is used as a pH adjusting agent, sulfuric acid, nitric acid, phosphoric acid, and the like are particularly preferable from the viewpoint of enhancing the polishing speed. When an organic acid is used as a pH adjusting agent, glycolic acid, succinic acid, maleic acid, citric acid, tartaric acid, malic acid, gluconic acid, itaconic acid, and the like are particularly preferable.

Examples of the base which may be used as a pH adjusting agent include an amine such as aliphatic amine or aromatic amine, an organic base such as quaternary ammonium hydroxide, hydroxide of an alkali metal such as potassium hydroxide, hydroxide of an element of Group II, and ammonia.

Among those pH adjusting agents, nitric acid, potassium hydroxide, phosphoric acid, sulfuric acid, maleic acid, and sodium hydroxide are more preferable from the viewpoint of the easy obtainability.

The pH adjusting agent may be used either singly or in combination of two or more types thereof. The addition amount of the pH adjusting agent is not particularly limited, and it is suitably adjusted such that the polishing composition can have a desired pH.

<(3) Controlling pH of Polishing Composition>

According to this method, by controlling pH of a polishing composition, the surface zeta potential of an object to be polished is equalized. According to this method, pH of the polishing composition is preferably 4 or higher, and more preferably 5 or higher. Furthermore, according to this method, pH of the polishing composition is preferably 10 or lower, and more preferably 8 or lower. Furthermore, for the method of (3), the method of (1) or (2) may or may not be used in combination.

As one of the methods for having neutral pH of a polishing composition, a method of using the above pH adjusting agent can be mentioned. However, it is also possible that a pH adjusting agent is not used.

The polishing composition used for the method of (3) contains a polishing accelerator. The polishing accelerator increases electrical conductivity of a polishing composition, and thus it has a function of decreasing the thickness of an electrostatic repulsive layer on a surface of an abrasive grain and enabling easy approach of an abrasive grain to an object to be polished. The polishing accelerator also enhances the polishing speed of a polishing composition for an object to be polished.

Examples of the polishing accelerator include a salt of an inorganic acid and a salt of an organic acid. The polishing accelerator may be used either singly or as a mixture of two or more types thereof. Furthermore, as the polishing accelerator, a commercially available product or a synthetic product may be used.

Specific examples of the salt which can be used as a polishing accelerator include potassium chloride, sodium sulfate, potassium nitrate, potassium carbonate, potassium tetrafluoroborate, potassium pyrophosphate, potassium oxalate, trisodium citrate, potassium (+)-tartrate, potassium hexafluorophosphate, ammonium sulfate, and ammonium nitrate.

The addition amount of the polishing accelerator is preferably 0.1% by mass or more, and more preferably 0.5% by mass or more relative to the total mass of the polishing composition. Furthermore, the addition amount of the polishing accelerator is preferably 10% by mass or less, and more preferably 5% by mass or less relative to the total mass of the polishing composition.

Next, descriptions are given for the polishing composition that is used for the polishing method of the present invention.

The polishing composition used in the present invention contains abrasive grains, a dispersing medium and, if necessary, a polishing accelerator or other components. Hereinbelow, descriptions are given for the components other than the polishing accelerator explained in the above.

[Polishing Composition]
<Abrasive Grains>

Examples of the type of the abrasive grains that are used for the polishing composition according to the present invention include metal oxide such as silica, alumina, zirconia, or titania. The abrasive grains may be used either singly or in combination of two or more types thereof. As for the abrasive grains, a commercially available product or a synthesized product may be used.

Preferred type of the abrasive grains is silica, and more preferred type is colloidal silica. Examples of the method for producing colloidal silica include a soda silicate method and a sol-gel method. Colloidal silica produced by anyone of those methods can be suitably used as the abrasive grains of the present invention. However, from the viewpoint of reducing metal impurities, colloidal silica produced by a sol-gel method allowing production with high purity is preferable.

Furthermore, it is preferable that the surfaces of the abrasive grains are coated with a silane coupling agent or an ionic dispersant, and also provided with zeta potential. As the surfaces of the abrasive grains are provided with zeta potential, it becomes easier to have an interaction toward a surface of an object to be polished, and thus the effect of planarizing the surface of an object to be polished is obtained at higher level.

<Immobilization>

As a method for coating surfaces of the abrasive grains with a silane coupling agent, the following immobilization method can be mentioned. For example, the immobilization can be carried out according to the method described in "Sulfonic acid-functionalized silica through of thiol groups", Chem. Commun. 246-247 (2003). Specifically, after coupling a silane coupling agent having thiol group like 3-mercaptopropyltrimethoxysilane to colloidal silica followed by oxidation of the thiol group with hydrogen peroxide, colloidal silica of which surface is immobilized with sulfonic acid can be obtained. Furthermore, those synthesized by the above method are used in Examples.

Alternatively, the immobilization can be carried out according to the method described in "Novel Silane Coupling Agents Containing a Photolabile 2-Nitrobenzyl Ester for Introduction of a Carboxy Group on the Surface of Silica Gel", Chemistry Letters, 3, 228-229 (2000), for example. Specifically, after coupling a silane coupling agent containing photoreactive 2-nitrobenzyl ester to colloidal silica followed by illumination with light, colloidal silica of which surface is immobilized with carbonic acid can be obtained.

Although those described above are colloidal silica having an anionic group, it is also possible to use colloidal silica having a cationic group. Examples of the colloidal silica having a cationic group include colloidal silica having an amino group immobilized on a surface of the silica. As for the method for producing colloidal silica having a cationic group, a method of immobilizing, on a surface of an abrasive grain, a silane coupling agent having an amino group such as aminopropyltrimethoxysilane, (aminoethyl)aminopropyltrimethoxysilane, aminopropyltriethoxysilane, aminopropyldimethylethoxysilane, aminopropylmethyldiethoxysilane, or aminobutyltriethoxysilane as described in JP 2005-162533 A can be mentioned. According to the method, colloidal silica having an amino group immobilized on a surface of the silica can be obtained. Furthermore, in Examples, the colloidal silica synthesized by the aforementioned method is used.

<Surface Modification>

With regard to the coating of the abrasive grains, there are abrasive grains of which surface is modified with an ionic dispersant other than the immobilization described above. The abrasive grains that are obtained by doing so are also referred to as surface-modified abrasive grains in the following.

(Ionic Dispersant)

The ionic dispersant means a polymer which has a functional group to be ionized in a dispersing medium (liquid temperature: 25° C.)

Examples of the ionic dispersant which is directly modified on surfaces of the abrasive grains include polycarbonic acid or a derivative thereof, polyamine or a derivative thereof, a quaternary ammonium salt-based polymer, and polyvinyl alcohol (PVA) or a derivative thereof.

Examples of the polycarbonic acid derivative include polycarbonic acid, polycarbonic acid ester, polycarbonic acid anhydride, polycarbonic acid amine salt, polycarbonic acid ammonium salt, and polycarbonic acid sodium salt. Examples of the polycarbonic acid ester include those having aliphatic hydrocarbon or aromatic hydrocarbon in an ester residue. Furthermore, as for the polycarbonic acid derivative, it is preferable to use polyacrylic acid or a derivative thereof. Examples of the polyacrylic acid or a derivative thereof include polyacrylic acid, polyacrylic acid ester, polyacrylic acid anhydride, polyacrylic acid amine salt, polyacrylic acid ammonium salt, and polyacrylic acid sodium salt.

Specific examples of the polyvinyl alcohol (PVA) derivative include an anion-modified PVA derivative such as carbonic acid-modified PVA, undecylenic acid-modified PVA, or sulfonic acid-modified PVA; and a cation-modified PVA derivative such as ammonium-modified PVA, sulfonium-modified PVA, and amino group-modified PVA.

The ionic dispersant may be used either singly or in combination of two or more types thereof. Furthermore, as for the ionic dispersant, a commercially available product or a synthesized product may be used.

Examples of the commercially available product of an ionic dispersant include SN Dispersant 5027, 5468, 4215 (all manufactured by SAN NOPCO LIMITED); GOHSENX T Series (T-350, T-330H or the like), GOHSENX L Series (L-3266 or the like), GOHSENX K Series (K-434 or the like) (all manufactured by The Nippon Synthetic Chemical Industry Co., Ltd.), and K Polymer Series (KL-506, KL-318, KL-118, KM-618, KM-118 or the like) and C polymer Series (C-506, CM-318 or the like) (all manufactured by Kuraray Co., Ltd.). However, the ionic dispersant is not limited to them, and various ionic dispersants can be used.

Method for producing the surface-modified abrasive grains is not particularly limited as long as it is a method by which an ionic dispersant is directly modified on surfaces of the abrasive grains. However, suitable methods are those that are described below.

Namely, the method for producing the surface-modified abrasive grains includes (1) a first step of preparing an abrasive grain dispersion containing the aforementioned abrasive grains; (2) a second step of adjusting the abrasive grain dispersion to have pH of 7 or more to 9 or less to produce a pH adjustment-completed dispersion, and (3) a third step of mixing the pH adjustment-completed dispersion with the ionic dispersant.

Accordingly, the surface-modified abrasive grains can be produced conveniently. Hereinbelow, descriptions are given for the method for producing the surface-modified abrasive grains using an ionic dispersant.

[First Step]

The first step is a step of preparing an abrasive grain dispersion containing abrasive grains. In this regard, it is possible to prepare an abrasive grain dispersion in which abrasive grains produced by a soda silicate method or a sol-gel method are dispersed in a dispersion. Alternatively, a commercially available product may be obtained, if available. In addition, the abrasive grain dispersion is preferably a water dispersion of abrasive grains. In that case, content of the abrasive grains is preferably 1% by mass or more and 50% by mass or less relative to the total mass of the abrasive grain dispersion.

[Second Step]

The second step is a step of adjusting the abrasive grain dispersion to have pH of 7 or more to 9 or less.

For having the adjustment to have pH of 7 or more to 9 or less, any method can be used. For example, the adjustment can be made by mixing a pH adjusting agent with the abrasive grain dispersion. The adjustment to have pH of 7 or more to 9 or less is carried out for the reasons of having the dispersion property of abrasive grains and having the ionic property of an ionic dispersant. The method for mixing is not particularly limited, either. It is preferable that a pH adjusting agent is added to the abrasive grain dispersion. Furthermore, specific examples of the pH adjusting agent are explained in the following. Furthermore, the pH value described in the present invention means a value which is measured at the conditions that are described in Examples.

[Third Step]

The third step is a step of mixing the pH adjustment-completed dispersion with the ionic dispersant.

This step is not particularly limited as long as it is a method allowing mixing of the pH adjustment-completed dispersion with the ionic dispersant. It is possible that the ionic dispersant is added to the pH adjustment-completed dispersion, and it is furthermore possible that the pH adjustment-completed dispersion is added to the ionic dispersant.

It is still furthermore possible that they are combined with each other. The method of adding the ionic dispersant to the pH adjustment-completed dispersion is suitable. In that case, the addition speed of the ionic dispersant is not particularly limited, either, and from the viewpoint of suppressing aggregation, it is preferably 0.1 g/min or more and 10 g/min or less, and more preferably 0.5 g/min or more and 5 g/min or less, for example.

The addition amount of the ionic dispersant is not particularly limited as long as it is an amount allowing direct modification of an ionic dispersant on the surfaces of abrasive grains. However, from the viewpoint of having more complete modification of a surface of each abrasive grain, the addition amount is preferably 0.0001 g or more and 1 g or less, more preferably 0.001 g or more and 0.5 g or less, and even more preferably 0.005 g or more and 0.1 g or less relative to 1 g of the abrasive grains.

Furthermore, the temperature at that time (liquid temperature) is not particularly limited, either. However, from the viewpoint of the adsorption and desorption reaction of an ionic dispersant, the temperature is preferably 10° C. or higher and 60° C. or lower, and more preferably 15° C. or higher and 40° C. or lower. Furthermore, during and/or after the addition, stirring is preferably performed. Thus, according to a preferred embodiment of the present invention, the third step is performed by stirring at the temperature condition of 10° C. or higher and 60° C. or lower. Furthermore, the stirring speed is not particularly limited, either. However, the stirring speed is preferably 100 rpm or more and 600 rpm or less, and more preferably 150 rpm or more and 500 rpm or less.

Furthermore, the time for mixing the pH adjustment-completed dispersion with the ionic dispersant is not particularly limited, either. However, from the viewpoint of having more complete production of the surface-modified abrasive grains, the time is preferably 5 minutes or more and 300 minutes or less, and more preferably 10 minutes or more and 120 minutes or less.

According to the above production method, the surface-modified abrasive grains can be produced conveniently.

The lower limit of the average primary particle size of the abrasive grains in the polishing composition is preferably 5 nm or higher, more preferably 7 nm or higher, even more preferably 10 nm or higher, still even more preferably 15 nm or higher, and particularly preferably 25 nm or higher. Furthermore, the upper limit of the average primary particle size of the abrasive grains is preferably 200 nm or lower, more preferably 150 nm or lower, even more preferably 100 nm or lower, still even more preferably 70 nm or lower, still even more preferably 60 nm or lower, and particularly preferably 50 nm or lower.

As the average primary particle size is within the above range, a defect like scratches on a surface of an object to be polished after polishing by using the polishing composition can be suppressed. Furthermore, the average primary particle size of the abrasive grains is calculated based on scanning electron microscopy (SEM), for example. In Examples of the present invention, the calculation is made similarly.

The lower limit of the average secondary particle size of the abrasive grains in the polishing composition is preferably 5 nm or higher, more preferably 7 nm or higher, even more preferably 10 nm or higher, still even more preferably 26 nm or higher, still even more preferably 36 nm or higher, still even more preferably 45 nm or higher, and particularly preferably 55 nm or higher. Furthermore, the upper limit of the average secondary particle size of abrasive grains is preferably 300 nm or lower, more preferably 260 nm or lower, even more preferably 220 nm or lower, still even more preferably 150 nm or lower, still even more preferably 120 nm or lower, still even more preferably 100 nm or lower, and particularly preferably 80 nm or lower. As the average secondary particle size is within the above range, an occurrence of a surface defect on a surface of an object to be polished after polishing by using the polishing composition can be suppressed more.

Furthermore, the secondary particle described herein indicates a particle which is formed by association of the abrasive grains in the polishing composition. The average secondary particle size of the secondary particle can be measured by a dynamic light scattering method, for example. In Examples of the present invention, the calculation is made similarly.

The lower limit of the ratio (in the present specification, it is also simply referred to as "D90/D10") of the diameter D90 of particles when the cumulative particle mass from the fine particle side reaches 90% of the total particle mass to the diameter D10 of particles when the cumulative particle mass from the fine particle side reaches 10% of the total particle mass of the entire particles is preferably 1.1 or more, more preferably 1.2 or more, even more preferably 1.3 or more, and particularly preferably 1.4 or more in the particle size distribution of the abrasive grains in the polishing composition, in which the particle size distribution is determined by a laser diffraction scattering method. Furthermore, the upper limit of the ratio D90/D10 is not particularly limited but is preferably 5.0 or less, more preferably 3.0 or less, even more preferably 2.5 or less, and particularly preferably 2.0 or less. As the ratio is the within this range, an occurrence of a surface defect on a surface of an object to be polished after polishing by using the polishing composition can be suppressed more. A small D90/D10 (close to 1.0) indicates a narrow particle size distribution width, and the increasing value indicates a wider particle size distribution width. In Examples of the present invention, the measurement is made similarly.

Furthermore, a commercially available product may be used as non-coated abrasive grains or immobilized abrasive grains.

The maximum absolute value of a difference between the surface zeta potential after equalization of surface zeta potential of a material contained in the object to be polished and the surface zeta potential of abrasive grains is preferably 20 mV or more and 200 mV or less. As the value is within that range, the effect of planarizing the surface of an object to be polished is obtained at higher level. Furthermore, the "maximum absolute value of a difference between the surface zeta potential after equalization of surface zeta potential of a material contained in the object to be polished and the surface zeta potential of abrasive grains" is calculated as described below. For the object to be polished, the surface zeta potential after equalization of surface zeta potential only of the material to be contained is measured. With regard to the abrasive grains, when only one kind is used, the surface zeta potential of the single kind is referred to as surface zeta potential of abrasive grains. When two or more types are used, surface zeta potential is measured for each abrasive grain, and the value obtained by weighted averaging of a measured value according to mixing ratio is referred to as surface zeta potential of the abrasive grains. Calculation is made for an absolute value of a difference between the obtained surface zeta potential of abrasive grains and the surface zeta potential after equalization of surface zeta potential only of each material contained in an object to be polishing. Then, the maximum value is defined as the "maximum absolute value of a difference between the surface zeta potential after equalization of surface zeta potential of a material contained in the object to be polished and the surface zeta potential of abrasive grains".

Furthermore, the surface zeta potential before equalization of surface zeta potential and the surface zeta potential after equalization of surface zeta potential of a material contained in the object to be polished, and the surface zeta potential of the abrasive grains are measured by a dynamic light scattering Doppler method using ELSZ-2000ZS (manufactured by Otsuka Electronics Co., Ltd.). The measurement is made similarly also in Examples.

<Dispersing Medium>

It is preferable that the polishing composition according to the present invention contains a dispersing medium for dispersing each component. As for the dispersing medium, water is preferable. Water containing impurities as little as possible is preferable from the viewpoint of suppressing the inhibition of the function of other components. Specifically, pure water or ultra-pure water obtained by removing foreign matters through a filter after impurity ions are removed using an ion exchange resin, or distilled water is preferable.

<Other Components>

The polishing composition according to the present invention may further contain other components such as an oxidizing agent, a metal anticorrosive, an antiseptic agent, an antifungal agent, a water soluble polymer, and an organic solvent for dissolving a sparingly soluble organic substance, if necessary. Hereinbelow, descriptions are given for an oxidizing agent, a metal anticorrosive, an antiseptic agent, and an antifungal agent, which are the preferred other components.

[Oxidizing Agent]

The oxidizing agent which may be added to the polishing composition has a function of oxidizing a surface of an object to be polished, and it can enhance the polishing speed of the polishing composition for an object to be polished.

Examples of the oxidizing agent which may be used include hydrogen peroxide, sodium peroxide, barium peroxide, ozone water, silver (II) salt, iron (III) salt, permanganese acid, chromic acid, dichromatic acid, peroxodisulfuric acid, peroxophosphoric acid, peroxosulfuric acid, peroxoboric acid, performic acid, peracetic acid, perbenzoic acid, perphthalic acid, hypochlorous acid, hypobromic acid, hypoiodic acid, chloric acid, chlorous acid, perchloric acid, bromic acid, iodic acid, periodic acid, persulfuric acid, dichloroisocyanuric acid, and a salt thereof. The oxidizing agent may be used either singly or as a mixture of two or more types thereof.

Content of the oxidizing agent in the polishing composition is preferably 0.1 g/L or more, more preferably 1 g/L or more, and even more preferably 3 g/L or more. As the content of the oxidizing agent increases, the polishing speed of the polishing composition for an object to be polished is further enhanced.

Furthermore, content of the oxidizing agent in the polishing composition is preferably 200 g/L or less, more preferably 100 g/L or less, and even more preferably 40 g/L or less. As the content of the oxidizing agent decreases, the cost required for materials of the polishing composition can be saved and a load involved with a treatment of the polishing composition after use, that is, a load involved with a waste water treatment, can be reduced. It is also possible to lower the possibility of having excessive oxidation of a surface of an object to be polished caused by an oxidizing agent.

[Metal Anticorrosive]

By adding a metal anticorrosive to the polishing composition, it is possible to further suppress generation of a recess on a side of the wiring by polishing using the polishing composition. In addition, it is possible to further suppress an occurrence of dishing on the surface of the object to be polished after the object to be polished is polished using the polishing composition.

The metal anticorrosive which can be used is not particularly limited, but it is preferably a heterocyclic compound or a surfactant. The number of members of the heterocyclic ring in the heterocyclic compound is not particularly limited. Furthermore, the heterocyclic compound may be a monocyclic compound or a polycyclic compound having a condensed ring. The metal anticorrosive may be used either singly or as a mixture of two or more types thereof. As the metal anticorrosive, a commercially available product or a synthetic product may be used.

Specific examples of the heterocyclic compound which can be used as a metal anticorrosive include a nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buteridin compound, a thiazole compound, an isothiazole compound, an oxazole compound, an isoxazole compound, and a furazan compound.

[Antiseptic Agent and Antifungal Agent]

Examples of the antiseptic agent and antifungal agent that are used in the present invention include an isothiazoline-based antiseptic agent such as 2-methyl-4-isothiazolin-3-one or 5-chloro-2-methyl-4-isothiazolin-3-one, paraoxybenzoate ester, and phenoxyethanol, and the like. These antiseptic agents and antifungal agents may be used either singly or as a mixture of two or more types thereof.

[Method for Producing Polishing Composition]

The method for producing the polishing composition according to the present invention is not particularly limited, and the composition can be obtained by stirring and mixing the abrasive grains, potential equalizing agent, and, if necessary, other components in the dispersing medium.

The temperature for mixing each component is, although not particularly limited, preferably 10° C. or higher and 40° C. or lower, and it is also possible to perform heating to increase the rate of dissolution. The time for mixing is not particularly limited, either.

[Polishing Method]

When polishing is carried out by using the polishing composition according to the present invention, it is possible to use a general polishing apparatus provided with a holder for holding a substrate or the like having an object to be polished, a motor or the like having a changeable rotation speed, and a polishing table to which a polishing pad (polishing cloth) can be attached.

As the polishing pad, a general nonwoven fabric, polyurethane, a porous fluororesin, or the like can be used without any particular limitation. The polishing pad is preferably groove-processed such that a polishing liquid can be stored therein.

Polishing conditions are not particularly limited, either. For example, the rotation speed of the polishing table is preferably 10 rpm or more and 500 rpm or less, and the pressure (polishing pressure) applied to a substrate having an object to be polished is preferably 0.5 psi or more and 10 psi or less. A method for supplying the polishing composition to a polishing pad is not particularly limited, either. For example, a method in which the polishing composition is supplied continuously using a pump or the like can be employed. The supply amount is not limited, but a surface of the polishing pad is preferably covered all the time with the polishing composition of the present invention.

Upon the completion of the polishing, the substrate is cleaned with flowing water, and according to the drying by removing water drops that are adhered on the substrate using a spin dryer or the like, a substrate having oxygen atoms and silicon atoms is obtained.

The polishing composition of the present invention can be either a single liquid type or a multi liquid type including a two liquid type in which part or all of the polishing composition is mixed at any mixing ratio. Furthermore, when a polishing apparatus having plural pathways for supplying the polishing composition is used, it is also possible to use two or more types of the previously prepared polishing composition such that the polishing compositions are mixed on a polishing apparatus.

Furthermore, the polishing composition of the present invention can be in the form of a stock solution, or it can be prepared by diluting the stock solution of the polishing composition with water. When the polishing composition is a two liquid type, the order for mixing and dilution can be any order. For example, it is possible that one composition is diluted with water followed by mixing of the liquids, the compositions are diluted with water simultaneously with mixing, or the mixed polishing compositions are diluted with water.

According to the polishing method of the present invention which has been described in the above, an object to be polished containing two or more types of materials can be planarized by polishing the object to be polished. Thus, one preferred embodiment of the present invention is a method for planarizing an object to be polished containing two or more types of materials by polishing the object to be polished using a polishing composition, in which the polishing composition contains a potential equalizing agent which has an adsorbing group for adsorption onto the two or more types of materials and a functional group for providing zeta potential.

EXAMPLES

The present invention will be described in greater detail with the following Examples and Comparative Examples. However, the technical scope of the present invention is not limited to the following Examples. Furthermore, unless specifically described otherwise, "%" and "parts" indicate "% by mass" and "parts by mass", respectively. Furthermore, unless specifically described otherwise, operations of the following Examples were carried out at conditions including room temperature (25° C.)/relative humidity of 40 to 50% RH.

Furthermore, the following 3 types were prepared as abrasive grains.

Anion modified colloidal silica: colloidal silica of which surface is immobilized with sulfonic acid (average primary particle size: 31 nm, average secondary particle size: 58 nm, and D90/D10=2.01)

Cation modified colloidal silica: colloidal silica of which surface is immobilized with amino group (average primary particle size: 32 nm, average secondary particle size: 61 nm, and D90/D10=1.98)

Non-coated colloidal silica: average primary particle size: 30 nm, average secondary particle size: 57 nm, and D90/D10=1.99)

Comparative Example 1

As abrasive grains, the above anion modified colloidal silica was stirred • dispersed in a dispersing medium (pure water) so as to have concentration of 1% by mass in the composition. Furthermore, as a pH adjusting agent, an aqueous solution of maleic acid (concentration: 30% by mass) was added such that concentration of maleic acid was 0.18% by mass in the composition, and thus a polishing composition was prepared (mixing temperature: about 25° C., mixing time: about 10 minutes). Furthermore, pH of the polishing composition (liquid temperature: 25° C.) was determined by a pH meter (model No.: LAQUA, manufactured by HORIBA, Ltd.), and, as a result, it was found to be 2.1.

Comparative Example 2

The polishing composition was produced in the same manner as Comparative Example 1 except that the abrasive grains were changed to non-coated colloidal silica.

Example 1

The polishing composition was produced in the same manner as Comparative Example 2 except that, as a charge equalizing agent, aminotrimethylenephosphonic acid (both the adsorbing group and functional group are a phosphonic acid group, manufactured by Chelest Corporation) was further added so as to have concentration of 1% by mass in the composition.

Example 2

The polishing composition was produced in the same manner as Example 1 except that, as a charge equalizing agent, dicyandiamide diethylenetriamine formalin condensate (both the adsorbing group and functional group are a secondary amino group, manufactured by Senka Corporation) was used.

Example 3

The polishing composition was produced in the same manner as Example 1 except that maleic acid solution was not used and, as a polishing accelerator, potassium carbonate was further added so as to have concentration of 1% by mass in the composition.

Example 4

As abrasive grains, the above cation modified colloidal silica was stirred • dispersed in a dispersing medium (pure water) so as to have concentration of 1% by mass in the composition. Furthermore, as a polishing accelerator, potassium carbonate was added so as to have concentration of 1% by mass in the composition, and thus a polishing composition was prepared (mixing temperature: about 25° C., mixing time: about 10 minutes). Furthermore, pH of the polishing composition (liquid temperature: 25° C.) was determined by a pH meter (model No.: LAQUA, manufactured by HORIBA, Ltd.), and, as a result, it was found to be 7.2

<Object to be Polished>

As an object to be polished, a patterned substrate in which lines are tungsten (W) and spaces are TEOS (silicon oxide film) was prepared.

[Surface Zeta Potential]

Surface zeta potential before potential equalization and surface zeta potential after potential equalization of each material contained in an object to be polished, and surface zeta potential of the abrasive grains were measured by a dynamic light scattering Doppler method using ELSZ-2000ZS (manufactured by Otsuka Electronics Co., Ltd.).

Surface zeta potential of the abrasive grains was measured by measuring a sample which was prepared by 10-fold dilution (by volume) of the abrasive grains to be used by using a flow cell and adjusting to a desired pH by using an aqueous solution of maleic acid and an aqueous solution of potassium hydroxide.

Furthermore, the surface potential of a substrate was measured by setting the patterned substrate cut to a size of 10 mm×30 mm on a jig for substrate and adding a 100-fold diluted aqueous solution of monitor particles (dispersion of polypropylene microparticles) to the liquid which has been adjusted to have a desired pH.

[Polishing Speed]

Polishing speed was measured when an object to be polished was polished at the following conditions by using each polishing composition obtained in the above.

(Conditions for Polishing)

Polishing apparatus: Mirra-200 mm polishing apparatus (manufactured by Applied Materials: AMAT)

Polishing pad: FUJIBO H800

Pressure: 1.5 psi

Conditioner (dresser): nylon brush (H800, manufactured by Fuji Boseki K.K.)

Platen (table) rotation number: 63 rpm

Head (carrier) rotation number: 57 rpm

Flow rate of polishing composition: 200 ml/min

Polishing time: 30 sec

TEOS polishing amount: 200 Å

For measuring the TEOS polishing amount, polishing was carried out by using a patterned substrate attached with tungsten wiring, and film thickness of TEOS part in stripe-shaped pattern part with total width of 2000 μm, in which the tungsten wiring part with width of 10 μm and the TEOS part with width of 10 μm are alternately provided, was obtained by using an automatic surface profiler WA-1300 (manufactured by Hitachi High Technologies Corporation) and it was taken as TEOS polishing amount.

Polishing speed (polishing rate) was evaluated by obtaining the film thickness of an object to be polished using a light interference type film thickness measurement device, and dividing the difference by polishing time (see the following equation).

$$\text{Polishing rate [Å/min]} = \frac{\text{Film thickness before polishing [Å]} - \text{Film thickness after polishing [Å]}}{\text{Polishing time [min]}} \quad \text{[Equation 1]}$$

The film thickness was obtained by using a light interference type film thickness measurement system (model number; ASET manufactured by KLA-Tencor), and the evaluation was made by dividing the difference in film thickness by polishing time.

Furthermore, the ratio (W/TEOS) between the polishing speed of tungsten (W) and the polishing speed of TEOS was calculated and recorded in the following Table 1.

[Erosion of TEOS]

Measurement of the erosion of TEOS was carried out by using an automatic surface profiler WA-1300 (manufactured by Hitachi High Technologies Corporation).

The results of evaluating the polishing compositions of Examples 1 to 4 and Comparative Examples 1 and 2 are shown in the following Table 1.

TABLE 1

|  |  | Comparative Example 1 | Comparative Example 2 | Example 1 | Example 2 | Example 3 | Example 4 |
|---|---|---|---|---|---|---|---|
| Composition of polishing composition | Aqueous solution of maleic acid (% by mass) | 0.18 | 0.18 | 0.18 | 0.18 | — | — |
|  | Anion modified colloidal silica (% by mass) | 5 | — | — | — | — | — |
|  | Cation modified colloidal silica (% by mass) | — | — | — | — | — | 5 |
|  | Non-coated colloidal silica (% by mass) | — | 5 | 5 | 5 | 5 | — |
|  | Aminotrimethylenephosphonic acid (% by mass) | — | — | 1 | — | 1 | — |
|  | Dicyandiamide diethylenetriamine formalin condensate (% by mass) | — | — | — | 1 | — | — |
|  | Potassium carbonate (% by mass) | — | — | — | — | 1 | 1 |
|  | pH | 2.1 | 2.1 | 2.1 | 2.1 | 7.2 | 7.2 |
| Surface zeta potential | TEOS | +10 mV | +10 mV | −30 mV | +24 mV | −20 mV | −45 mV |
|  | W | −40 mV | −40 mV | −38 mV | +24 mV | −40 mV | −45 mV |
|  | Abrasive grains | −45 mV | −5 mV | −40 mV | +35 mV | −25 mV | +35 mV |
|  | Maximum absolute value of difference between object to be polished and abrasive grains | 55 mV | 35 mV | 10 mV | 11 mV | 15 mV | 80 mV |
| Evaluation results | W polishing speed [Å/min] | 222 | 216 | 218 | 232 | 261 | 243 |
|  | TEOS polishing speed [Å/min] | 234 | 228 | 265 | 248 | 281 | 255 |
|  | W/TEOS selection ratio | 0.95 | 0.95 | 0.82 | 0.94 | 0.93 | 0.95 |
|  | Erosion (Å) | 350 | 270 | 120 | 132 | 120 | 200 |

As it is clearly shown from the above Table 1, it was found that the polishing compositions of Examples have enhanced erosion performance compared to the polishing compositions of Comparative Examples, thus allowing performing of sufficient planarization.

Furthermore, this application is based upon the Japanese Patent Application No. 2015-192422 filed on Sep. 30, 2015, and the entire disclosed contents of which are incorporated herein by reference.

The invention claimed is:

1. A polishing method for polishing an object to be polished containing tungsten and at least one of silicon oxide film and silicon nitride by using a polishing composition, the polishing method comprising
equalization of the surface zeta potential of said tungsten and at least one of said silicon oxide film and said silicon nitride,
wherein the equalization is carried out by including a potential equalizing agent having an adsorbing group for adsorption onto said tungsten and at least one of said silicon oxide film and said silicon nitride and a functional group for providing zeta potential in the polishing composition,
wherein the potential equalizing agent is dicyandiamide diethylenetriamine formalin condensate.

2. The polishing method according to claim 1, wherein the polishing composition contains abrasive grains, and a surface of the abrasive grain is coated with a silane coupling agent or an ionic dispersant and is provided with zeta potential.

3. The polishing method according to claim 2, wherein a maximum absolute value of a difference between the surface zeta potential after equalization of the surface zeta potential of said tungsten or at least one of said silicon oxide film and said silicon nitride and the surface zeta potential of the abrasive grains is 20 mV or more and 200 mV or less.

4. A method for planarizing an object to be polished containing tungsten and at least one of silicon oxide film and silicon nitride by polishing the object to be polished using the polishing method set forth in claim 1 using a polishing composition in which the polishing composition contains a potential equalizing agent which has an adsorbing group for adsorption onto said tungsten and at least one of said silicon oxide film and said silicon nitride and a functional group for providing zeta potential.

5. The method according to claim 1, wherein the object to be polished contains tungsten and silicon oxide film, and the method comprises equalization of the surface zeta potential of the tungsten and the silicon oxide film.

6. A polishing method for polishing an object to be polished containing tungsten and at least one of silicon oxide film and silicon nitride by using a polishing composition, the polishing method comprising
equalization of the surface zeta potential of said tungsten and at least one of said silicon oxide film and said silicon nitride,
wherein the equalization is carried out by impregnating the object to be polished in a potential equalizing agent having an adsorbing group for adsorption onto said tungsten and at least one of silicon oxide film and silicon nitride and a functional group for providing zeta potential,
wherein the potential equalizing agent is dicyandiamide diethylenetriamine formalin condensate.

* * * * *